US008952386B2

(12) United States Patent
You et al.

(10) Patent No.: US 8,952,386 B2
(45) Date of Patent: Feb. 10, 2015

(54) ORGANIC LIGHT-EMITTING DISPLAY APPARATUS AND METHOD OF MANUFACTURING ORGANIC LIGHT-EMITTING DISPLAY APPARATUS

(75) Inventors: Chun-Gi You, Yongin (KR); Joon-Hoo Choi, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 13/592,508

(22) Filed: Aug. 23, 2012

(65) Prior Publication Data

US 2013/0161632 A1   Jun. 27, 2013

(30) Foreign Application Priority Data

Dec. 23, 2011 (KR) .................. 10-2011-0141715

(51) Int. Cl.
*H01L 29/12* (2006.01)

(52) U.S. Cl.
USPC ............................................. 257/71; 257/59

(58) Field of Classification Search
CPC ..................................................... H01L 29/786
USPC .............................................. 257/59, 71, 72
See application file for complete search history.

(56) References Cited

U.S. PATENT DOCUMENTS

| 6,636,279 B2 | 10/2003 | Takasugi et al. | |
|---|---|---|---|
| 2011/0042678 A1* | 2/2011 | Kim et al. | 257/72 |
| 2011/0108848 A1* | 5/2011 | Lee et al. | 257/72 |
| 2012/0146060 A1* | 6/2012 | Moon et al. | 257/88 |

FOREIGN PATENT DOCUMENTS

| JP | 05-218018 A | 8/1993 |
|---|---|---|
| KR | 10-2002-0009414 A | 2/2002 |
| KR | 10-2005-0064876 A | 6/2005 |
| KR | 10-2008-0052782 A | 6/2008 |

* cited by examiner

*Primary Examiner* — Matthew Reames
(74) *Attorney, Agent, or Firm* — Lee & Morse, P.C.

(57) ABSTRACT

An OLED apparatus including a thin film transistor including an activation layer, a gate electrode insulated from the activation layer and including a lower gate electrode and an upper gate electrode, an interlayer insulation film covering the gate electrode, and a source and drain electrode on the insulation film and contacting the activation layer; an OLED including a pixel electrode electrically connected to the thin film transistor, an intermediate layer including an emissive layer, and an opposite electrode; a blister prevention layer on a same level as the activation layer; a gate insulation layer covering the activation layer and the blister prevention layer and insulating the activation layer from the gate electrode; and an interconnection unit including first and second layers on a portion of the gate insulation layer overlying the blister prevention layer, wherein the blister prevention layer protects the interconnection unit on the gate insulation layer from blistering.

11 Claims, 11 Drawing Sheets

ORGANIC LIGHT-EMITTING DISPLAY APPARATUS AND METHOD OF MANUFACTURING ORGANIC LIGHT-EMITTING DISPLAY APPARATUS

CROSS-REFERENCE TO RELATED PATENT APPLICATION

This application claims the benefit of Korean Patent Application No. 10-2011-0141715, filed on Dec. 23, 2011, in the Korean Intellectual Property Office, the disclosure of which is incorporated herein in its entirety by reference.

BACKGROUND

1. Field

Embodiments relate to an organic light-emitting display apparatus and a method of manufacturing the organic light-emitting display apparatus.

2. Description of the Related Art

Recently, replacing display apparatuses with portable thin film flat panel display apparatuses has been considered. Among flat panel display apparatuses, an organic light-emitting display apparatus is a self-emission display apparatus and has a wide viewing angle, a high contrast ratio, and a high response speed. Due to these advantages, an organic light-emitting display apparatus is getting much attention as a next-generation display apparatus.

An organic light-emitting display apparatus includes an intermediate layer; a first electrode, and a second electrode. The intermediate layer includes an organic emissive layer, and when a voltage is applied to the first electrode and the second electrode, the organic emissive layer emits visible light.

SUMMARY

Embodiments provide an organic light-emitting display apparatus that improves an adhesion defect between a gate insulation layer and an indium tin oxide (ITO) layer and a method of manufacturing the same.

According to an aspect of example embodiment, there is provided an organic light-emitting display apparatus including: a thin film transistor including an activation layer, a gate electrode that is insulated from the activation layer and includes a lower gate electrode and an upper gate electrode, an interlayer insulation film covering the gate electrode, and a source electrode and a drain electrode which are formed on the insulation film and contact the activation layer; an organic light-emitting device including a pixel electrode electrically connected to the thin film transistor, an intermediate layer including an emissive layer, and an opposite electrode, which are sequentially deposited in this stated order; a blister prevention layer formed at the same level as the activation layer; a gate insulation layer that covers the activation layer and the blister prevention layer and insulates the activation layer from the gate electrode; and an interconnection unit including first and second layers that are deposited on a portion of the gate insulation layer corresponding to the blister prevention layer, wherein the blister prevention layer prevents the interconnection unit on the gate insulation layer from blistering.

The blister prevention layer may be formed at the same level as the activation layer.

The blister prevention layer may have a surface having a plurality of protrusions.

A surface of the gate insulation layer which faces the interconnection unit may have roughness formed due to the protrusions of the blister prevention layer.

The blister prevention layer may include polysilicon.

The lower gate electrode, and the pixel electrode may each include a transparent conductive metal oxide.

The first layer, the lower gate electrode, and the pixel electrode may each include at least one selected from the group of indium tin oxide (ITO), indium zinc oxide (IZO), zinc oxide (ZnO), indium oxide ($In_2O_3$), indium gallium oxide (IGO), and aluminum zinc oxide (AZO).

The upper gate electrode may include at least one material selected from the group of Ag, Mg, Al, Pt, Pd, Au, Ni, Nd, Ir, Cr, Li, Ca, Mo, Ti, W, MoW, and Cu.

The organic light-emitting display apparatus may further include a capacitor including: a lower capacitor electrode formed at the same level as the activation layer and a upper capacitor electrode formed on the gate insulation layer, wherein the capacitor is electrically coupled to the thin film transistor.

The first layer may be formed at the same level as the lower gate electrode.

According to another aspect of example embodiment, there is provided a method of manufacturing an organic light-emitting display apparatus, wherein the method includes: a first mask process for forming an activation layer of a thin film transistor and a blister prevention layer on a substrate; a second mask process for forming a first electrode unit for forming a pixel electrode, a gate electrode, and an interconnection unit on the substrate; a third mask process for forming an interlayer insulation film having contact holes exposing opposite edges of the activation layer and an opening exposing a portion of the first electrode unit; a fourth mask process for forming source and drain electrodes that contact the activation layer through the contact holes and forming a pixel electrode from the first electrode unit; and a fifth mask process for forming a pixel define layer exposing at least a portion of the pixel electrode.

The first mask process may include: forming a silicon layer on the substrate; crystallizing the silicon layer; and patterning the crystallized silicon layer to form the activation layer and the blister prevention layer.

The first mask process may further include: forming a lower capacitor electrode at the same level as the activation layer on the substrate; forming an upper capacitor electrode on the lower capacitor electrode.

The second mask process may include: sequentially forming a gate insulation layer, a first conductive layer, and a second conductive layer in this stated order on the substrate to cover the activation layer and the blister prevention layer; and patterning the first conductive layer and the second conductive layer on the activation layer to form a gate electrode including the first conductive layer as a lower gate electrode and the second conductive layer as a upper gate electrode.

When the gate electrode is formed, the first conductive layer and the second conductive layer are patterned on the blister prevention layer to form the interconnection unit including the first conductive layer as a first layer and the second conductive layer as a second layer.

The first layer may be formed at the same level as the lower gate electrode.

The fourth mask process may include: forming a third conductive layer on the interlayer insulation film; patterning the third conductive layer to form the source and drain electrodes; and removing the second conductive layer that constitutes the first electrode unit to form a pixel electrode that constitutes the first conductive layer.

The third mask process may include: forming an insulation layer on the first electrode unit and the gate electrode; and patterning the insulation layer to form the contact holes and the opening exposing a portion of the first electrode unit.

The fifth mask process may include: forming an insulation layer on a whole surface of the substrate to cover the source electrode and the drain electrode; and patterning the insulation layer to form the pixel define layer.

The method may further include, following the fifth mask process, forming an intermediate layer including an emissive layer, and an opposite electrode on the pixel electrode.

The first conductive layer may include at least one material selected from the group of indium tin oxide (ITO), indium zinc oxide (IZO), zinc oxide (ZnO), indium oxide ($In_2O_3$), indium gallium oxide (IGO), and aluminum zinc oxide (AZO).

BRIEF DESCRIPTION OF THE DRAWINGS

The embodiments will become apparent by describing in detail exemplary embodiments thereof with reference to the attached drawings in which.

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

Hereinafter, the structure and operation of the example embodiments are described in detail below with reference to embodiments illustrated in the attached drawings.

Figure 1:
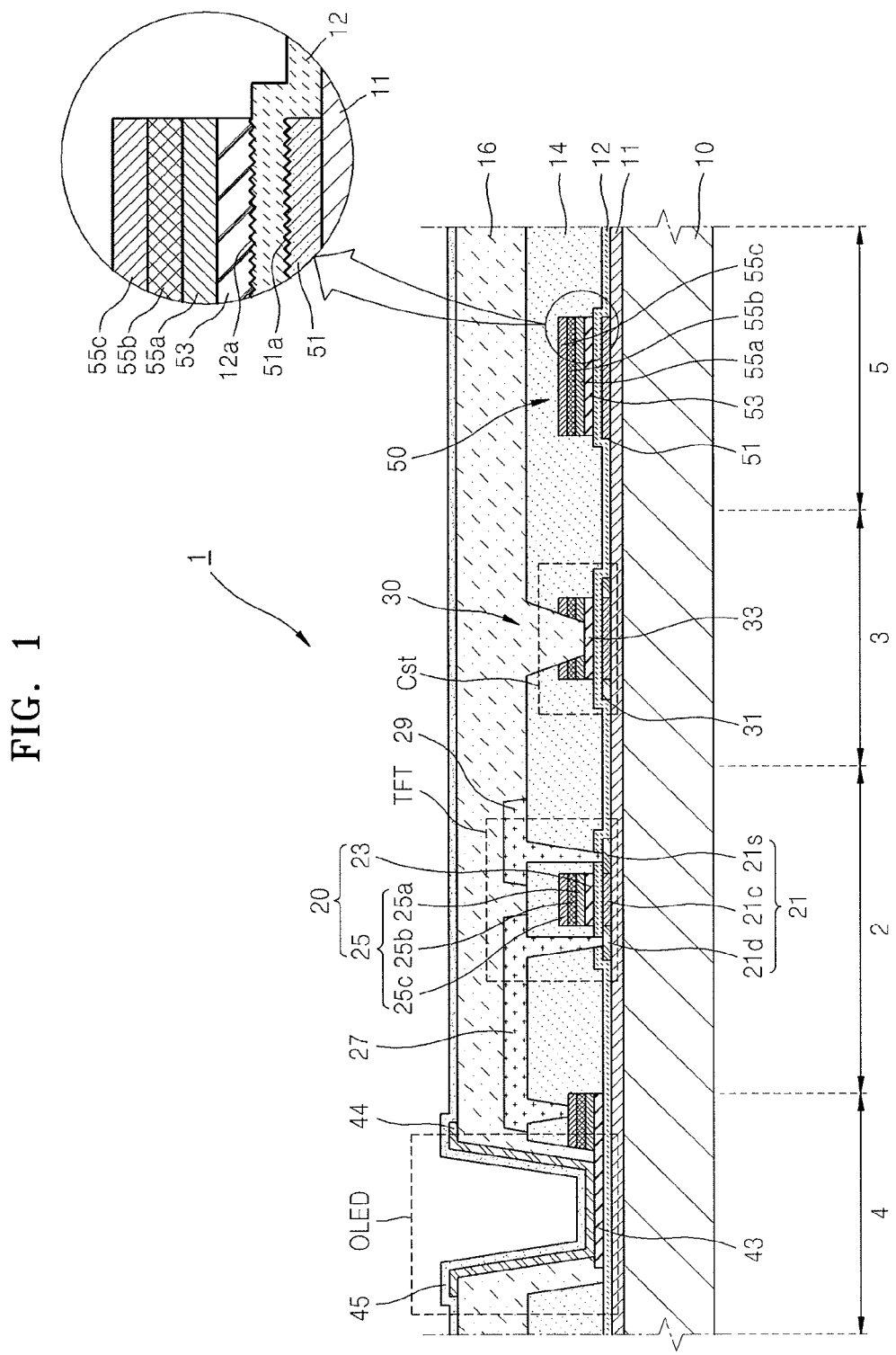
FIG. 1 illustrates a schematic cross-sectional view of an organic light-emitting display apparatus according to an embodiment.

FIG. 1 illustrates a schematic cross-sectional view of an organic light-emitting display apparatus 1 according to an embodiment.

Referring to FIG. 1, the organic light-emitting display apparatus 1 according to the present embodiment may include a first substrate 10 including a plurality of light-emitting pixels, and a second substrate (not shown) that is coupled with the first substrate 10 by sealing.

For example, a thin film transistor (TFT), an organic light-emitting device OLED, and a capacitor Cst may be formed on the first substrate 10. The first substrate 10 may be a low temperature polysilicon substrate, a glass substrate, a plastic substrate, or the like.

The second substrate (not shown) may be an encapsulation substrate that is disposed on the first substrate 10 to block external humidity or air from permeating into a thin film transistor (TFT) or a light-emitting pixel on the first substrate 10. The second substrate may face the first substrate 10, and the first substrate 10 and the second substrate may be coupled to each other by a sealing member (not shown) disposed along edges of the first substrate 10 and the second substrate. The second substrate may be a glass substrate, a plastic substrate, or a stainless steel (SUS) substrate.

The first substrate 10 may be divided into a transistor region 2, a storage region 3, a light-emitting region 4, and an interconnection region 5.

The transistor region 2 may include a TFT as a driving device. The TFT may include an activation layer 21, a gate electrode 20, and source and drain electrodes 29 and 27.

The gate electrode 20 may include a lower gate electrode 23 and a upper gate electrode 25 (on the lower gate electrode 23). In an implementation, the lower gate electrode 23 may include a transparent conductive material including at least one selected from the group of indium tin oxide (ITO), indium zinc oxide (IZO), zinc oxide (ZnO), indium oxide ($In_2O_3$), indium gallium oxide (IGO), and aluminum zinc oxide (AZO).

The upper gate electrode 25 may include three layers 25a, 25b, and 25c. The embodiments are not limited thereto, and the upper gate electrode 25 may include a single or multi-layer of metal or metal alloy, e.g., Mo, MoW, or an Al-based alloy.

A gate insulation layer 12 may be disposed between the gate electrode 20 and the activation layer 21 to insulate the gate electrode 20 from the activation layer 21.

The activation layer 21 may have source and drain regions 21s and 21d that are doped with high concentrations of impurities at opposite edges thereof. The source and drain regions 21s and 21d may be respectively connected to the source and drain electrodes 29 and 27.

The storage region 3 may include a capacitor Cst. The capacitor Cst may include a lower capacitor electrode 31 and a upper capacitor electrode 33. The gate insulation layer 12 may be interposed between the lower capacitor electrode 31 and the upper capacitor electrode 33.

The lower capacitor electrode 31 may be disposed at a same level as the activation layer 21 of the TFT. The lower capacitor electrode 31 may include a semiconductor material and may be doped with impurities to improve electric conductivity thereof.

The upper capacitor electrode 33 may be disposed at a same level as the lower gate electrode 23 of the TFT and a pixel electrode 43 of the organic light-emitting device EL. For example, the upper capacitor electrode 33 may include a transparent conductive material, e.g., the same transparent conductive material, as used in the lower gate electrode 23.

The light-emitting region 4 may include an organic light-emitting device OLED. The organic light-emitting device OLED may include the pixel electrode 43 (connected to one of the source and drain electrodes 29 and 27 of the TFT), an opposite electrode 45 (facing the pixel electrode 43), and an intermediate layer 44 (interposed between the pixel electrode 43 and the opposite electrode 45). The pixel electrode 43 may include a transparent conductive material, and may be disposed at a same level at the lower gate electrode 23 of the TFT. In an implementation, the pixel electrode 43 may include the same material used in the lower gate electrode 23.

The interconnection region 5 may include an interconnection unit 50. Although not illustrated, the interconnection unit 50 may be electrically connected to the TFT and/or the organic light-emitting device EL. The interconnection unit 50 may be disposed on the gate insulation layer 12. The interconnection unit 50 may include a first layer 53 and second layers 55a, 55b, and 55c. The first layer 53 may be disposed at a same level as the lower gate electrode 23. In an implementation, the first layer 53 may include the same material as used in the lower gate electrode 23. The second layers 55a, 55b, and 55c may be disposed at a same level as the upper gate electrode 25. In an implementation, the second layers 55a, 55b, and 55c may include the same material as used in the upper gate electrode 25. For example, the first layer 53 may be formed on the gate insulation layer 12 of the interconnection region 5, and the second layers 55a, 55b, and 55c may be formed on the first layer 53.

The first layer 53 may include a transparent conductive material, e.g., the same transparent conductive material, as used in the lower gate electrode 23. For example, the first layer 53 may include at least one selected from the group of indium tin oxide (ITO), indium zinc oxide (IZO), zinc oxide (ZnO), indium oxide ($In_2O_3$), indium gallium oxide (IGO), and aluminum zinc oxide (AZO).

A number of the second layers 55a, 55b, and 55c may be three, as in the upper gate electrode 25 that includes three layers 55a, 55b, and 55c. The embodiments are not limited thereto, and the second layers 55a, 55b, and 55c may each include a single or multi-layer of metal or metal alloy, e.g., Mo, MoW, or an Al-based alloy.

Corresponding to the interconnection unit 50, a blister prevention layer 51 may be disposed under the gate insulation layer 12. For example, the gate insulation layer 12 may be disposed between the interconnection unit 50 and the blister prevention layer 51. In an implementation, the blister prevention layer 51 and the activation layer 21 may be simultaneously formed, and the blister prevention layer 51 may include polysilicon, e.g., the same polysilicon, as used in the activation layer 21. A surface of the blister prevention layer 51 that faces the interconnection unit 50 may include a protrusion 51a. Due to the protrusion 51a, the gate insulation layer 12 formed on the blister prevention layer 51 may have a roughness 12a.

The blister prevention layer 51 (having the protrusion 51a) may help prevent blistering from occurring between the interconnection unit 50 and the gate insulation layer 12. For example, the first layer 53 of the interconnection unit 50 may include a transparent conductive material, such as ITO, and the gate insulation layer 12 may include an inorganic material, such as $SiN_X$ or $SiO_x$. The first layer 53 including the transparent conductive material such as ITO may have a weak adhesive force with respect to the gate insulation layer 12 including the inorganic material due to property differences therebetween. For example, after high-temperature heating, the first layer 53 may swell on the gate insulation layer 12. Such swelling may be known as a blistering phenomenon. For example, the substrate 10 may have a relatively large area and the interconnection unit 50 may have a relatively large area. Thus, likelihood of blistering of the first layer 53 of the interconnection unit 50 may be relatively increased. According to an embodiment, the blister prevention layer 51 may have the protrusion 51a at its surface, and due to the protrusion 51a, an upper surface of the gate insulation layer 12 on the blister prevention layer 51 may have a roughness 12a. Thus, a contact area of the gate insulation layer 12 and the first layer 53 may be increased, and an adhesion stress may be dispersed to thereby help prevent the blistering of the first layer 53. Also, according to an embodiment, the blister prevention layer 51 may be formed on an auxiliary layer 11 together with the activation layer 21 during the same process. Thus, blistering of the first layer 53 may be prevented without a separate additional process.

For example, blistering may occurs in an interconnection unit having a great interconnection width. In this regard, thermal processing may be performed at 450° C. after ILD. In this case, an ITO compound having excellent thermal expansion of a lower part may not contract/expand, and an Al interconnection of an upper part having low thermal expansion contracts/expands. At this time, as the width of the interconnection may be greater, the thermal expansion of the Al interconnection may increase. Thus, a gate interconnection may become buoyant. If an activation layer is inserted into the lower part, stress may be reduced between grain boundaries of the activation layer during contraction and expansion. Thus, the gate interconnection may be prevented from becoming buoyant.

FIGS. 2 to 11 illustrate schematic cross-sectional views of stages in a method of manufacturing the organic light-emitting display apparatus 1 of FIG. 1, according to an embodiment. Hereinafter, a method of manufacturing the organic light-emitting display apparatus 1 of FIG. 1 is described in detail.

Figure 2:
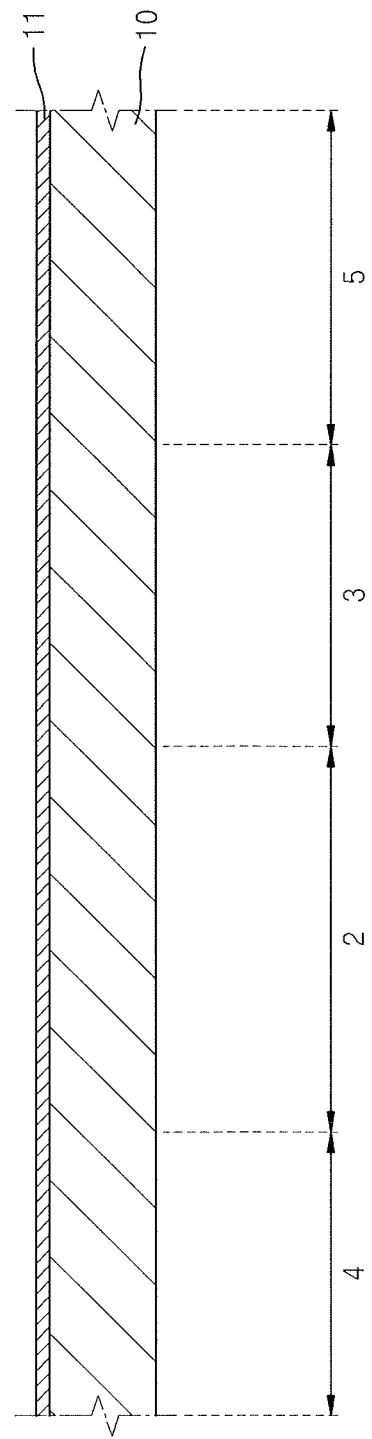
FIGS. 2 to 11 illustrate schematic cross-sectional views of stages in a method of manufacturing an organic light-emitting display apparatus, according to an embodiment.

First, as illustrated in FIG. 2, the auxiliary layer 11 may be formed on the first substrate 10. For example, the first substrate 10 may be formed of a transparent glass material that includes $SiO_2$ as a major component. However, the material for forming the first substrate 10 is not limited thereto, and various other materials, e.g., a transparent plastic material or a metallic material, may also be used to form the first substrate 10.

The auxiliary layer 11, e.g., a barrier layer, a blocking layer, and/or a buffer layer, may be formed on a top surface of the first substrate 10 to help prevent dispersion of impurity ions and permeation of humidity or external air and to planarize the top surface. The auxiliary layer 11 may be formed by depositing $SiO_2$ and/or $SiN_X$ by using various deposition methods, e.g., plasma enhanced chemical vapor deposition (PECVD), atmospheric pressure CVD (APCVD), or low pressure CVD (LPCVD).

Figure 3:
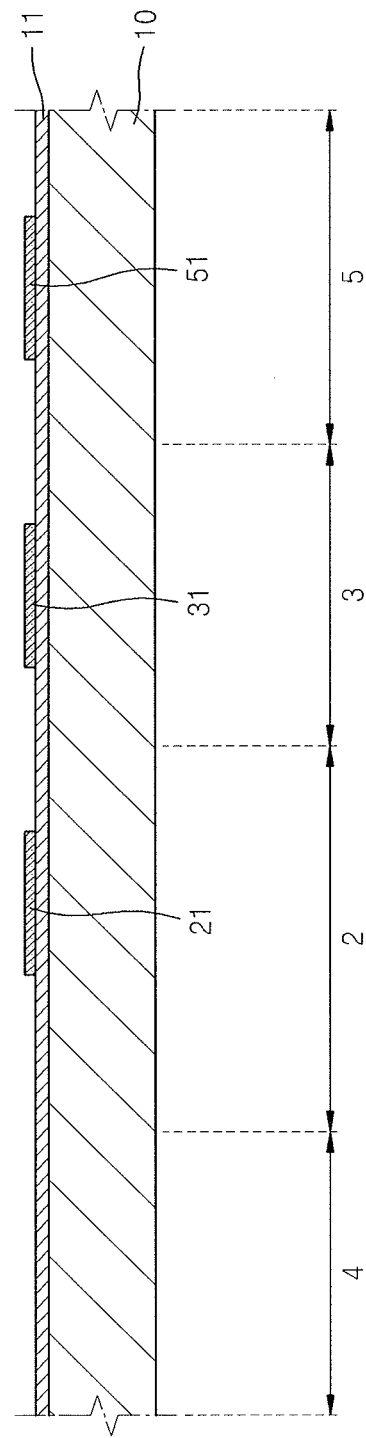

Then, as illustrated in FIG. 3, the activation layer 21 of the TFT, the lower capacitor electrode 31, and the blister prevention layer 51 may be formed on the auxiliary layer 11. For example, an amorphous silicon layer (not shown) may be deposited on the auxiliary layer 11 and then crystallized to form a polycrystalline silicon layer (not shown). The crystallization of amorphous silicon may be achieved by using various methods, e.g., rapid thermal annealing (RTA), solid phase crystallization (SPC), excimer laser annealing (ELA), metal induced crystallization (MIC), metal induced lateral crystallization (MILC), or sequential lateral solidification (SLS). Then, the polycrystalline silicon layer may be patterned to form the activation layer 21 of the TFT, the lower capacitor electrode 31, and the blister prevention layer 51 through a mask process using a first mask (not shown).

In the present embodiment, the activation layer 21 and the lower capacitor electrode 31 may be formed separately. However, in an implementation, the activation layer 21 and the lower capacitor electrode 31 may instead be integrally formed. For example, the activation layer 21 may form a channel, the lower capacitor electrode 31 may form a capacitor electrode, and the blister prevention layer 51 may form a power interconnection layer.

Figure 4:
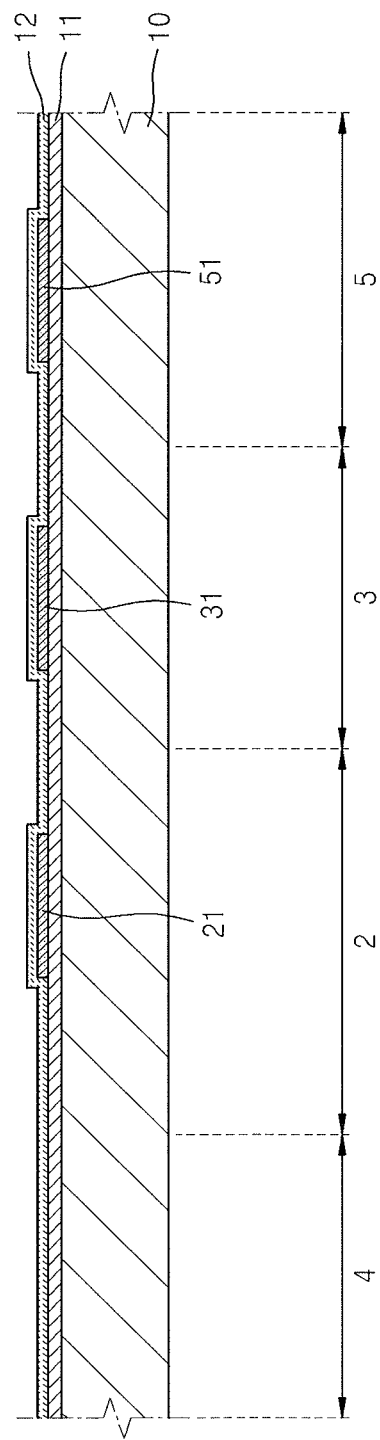

Then, as illustrated in FIG. 4, the gate insulation layer 12 may be formed on a whole surface of the first substrate 10 (on which the activation layer 21, the lower capacitor electrode 31, and the blister prevention layer 51 have been formed).

To form the gate insulation layer 12, an inorganic insulation film formed of, e.g., $SiN_x$ or $SiO_x$, may be deposited by, e.g., PECVD, APCVD, LPCVD, or the like. The gate insulation layer 12 may be interposed between the activation layer 21 of the TFT and the gate electrode 20 (described below) to function as a gate insulation layer of the TFT, and may be interposed between the upper capacitor electrode 33 (described below) and the lower capacitor electrode 31 (described below) to function as a dielectric layer of the capacitor Cst.

The blister prevention layer 51 may have the protrusion (51a of FIG. 1). Thus, the gate insulation layer 12 (covering the blister prevention layer 51) may correspondingly have a roughness (12a of FIG. 1).

Figure 5:
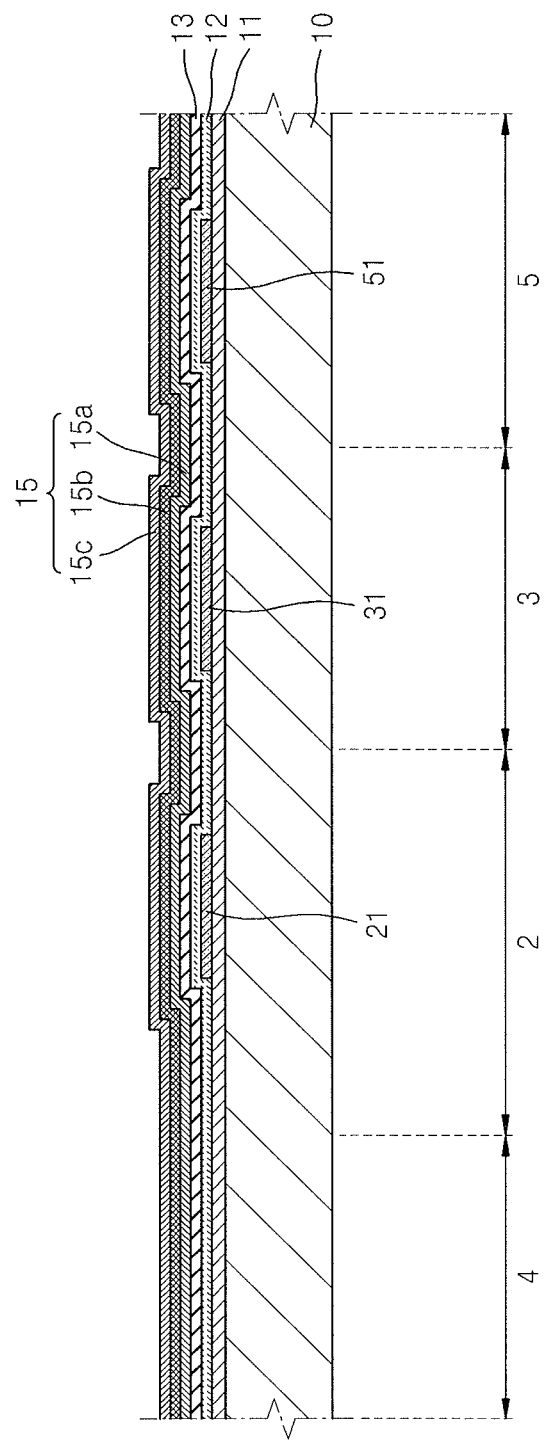

Then, as illustrated in FIG. 5, the first conductive layer 13 and the second conductive layer 15 may be sequentially formed on a whole surface of the first substrate 10 (on which the gate insulation layer 12 is formed).

The first conductive layer 13 may include at least one transparent material selected from the group of ITO, IZO, ZnO, and $In_2O_3$. As will be described below, the first conductive layer 13 may be patterned to form the pixel electrode 43, the lower gate electrode 23, the upper capacitor electrode 33, and the first layer 53 of the interconnection unit 50.

The second conductive layer 15 may include the first, second, and third layers 15a, 15b, and 15c sequentially stacked in this stated order. The second conductive layer 15 may have a three-layer structure of Mo—Al—Mo. However, the embodiments are not limited thereto, and the second conductive layer 15 may include at least one material selected from the group of Ag, Mg, Al, Pt, Pd, Au, Ni, Nd, Ir, Cr, Li, Ca, Mo, Ti, W, MoW, and Cu. As will be described, below, the second conductive layer 15 may be patterned to form the upper gate electrode 25, and the second layers 55a, 55b, and 55c of the interconnection unit 50.

In an implementation, the first conductive layer 13 may include various other suitable materials that have a stronger corrosion resistance than the second conductive layer 15. The second conductive layer 15 may include various other suitable materials that have lower resistance to allow current to flow more easily than the first conductive layer 13.

Figure 6:
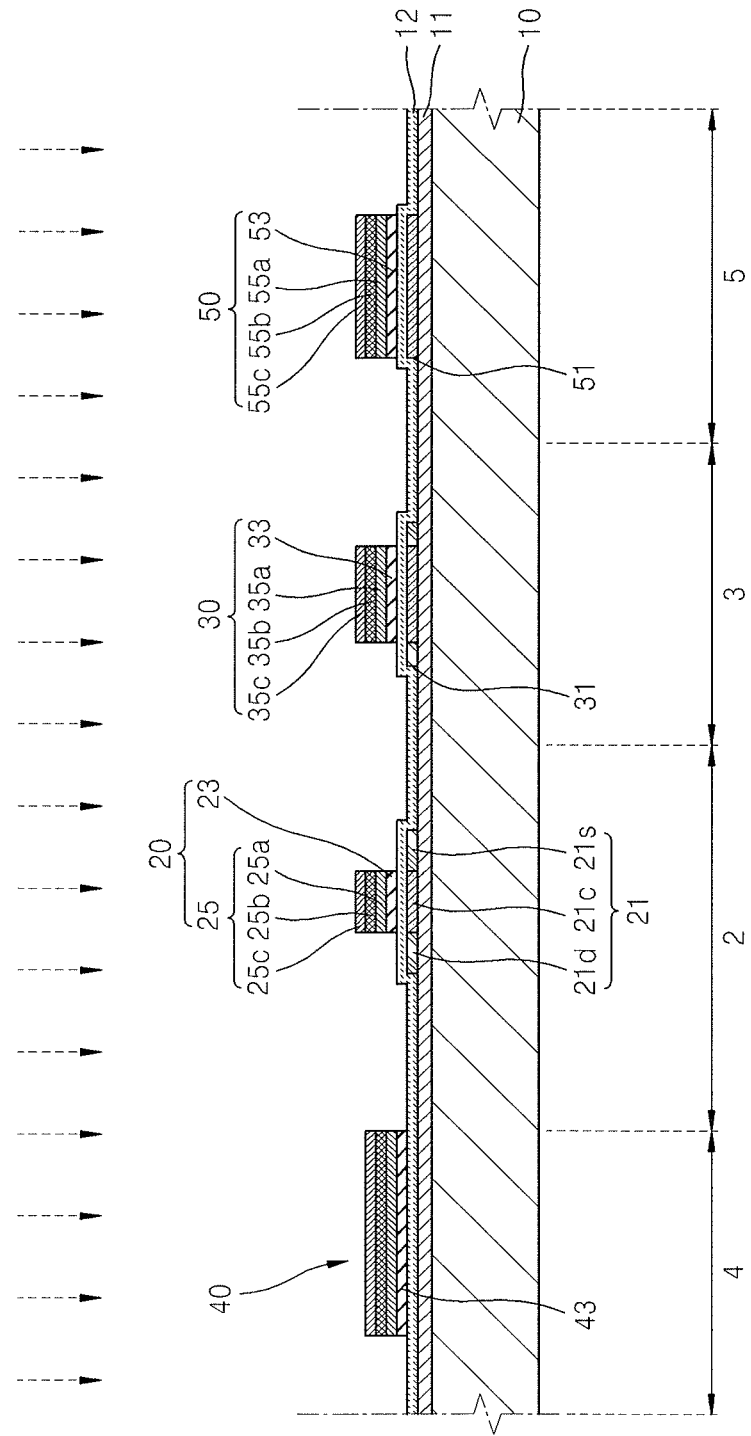

Then, as illustrated in FIG. 6, the gate electrode 20, a first electrode unit 40, a second electrode unit 30, and the interconnection unit 50 may be separately formed on the first substrate 1.

For example, the first conductive layer 13 and the second conductive layer 15 (which are sequentially deposited on the whole surface of the first substrate 10) may be patterned by using a mask process using a second mask (not shown).

For example, in the transistor region 2, the gate electrode 20 may be formed on the activation layer 21, and the gate electrode 20 may include the lower gate electrode 23 (e.g., a portion of the first conductive layer 13) and the upper gate electrode 25 (e.g., a portion of the second conductive layer 15).

In this regard, the gate electrode 20 may correspond to a central portion of the activation layer 21, and the activation layer 21 may be doped with an n-type or p-type impurity by using the gate electrode 20 as a self align mask to form the source and drain regions 21s and 21d (at edges of the activation layer 21 corresponding to opposite sides of the gate electrode 20) and a channel region 21c interposed therebetween. In an implementation, the impurity may include, e.g., a boron (B) ion or a phosphorous (P) ion.

In the storage region 3, the second electrode unit 30 (for forming the upper capacitor electrode 33) may be formed on the lower capacitor electrode 31. In the light-emitting region 4, the first electrode unit 40 (for forming the pixel electrode 43) may be formed. In the interconnection region 5, the interconnection unit 50 (including the first layer 53, and the second layer 55a, 55b, and 55c) may be formed.

Figure 7:
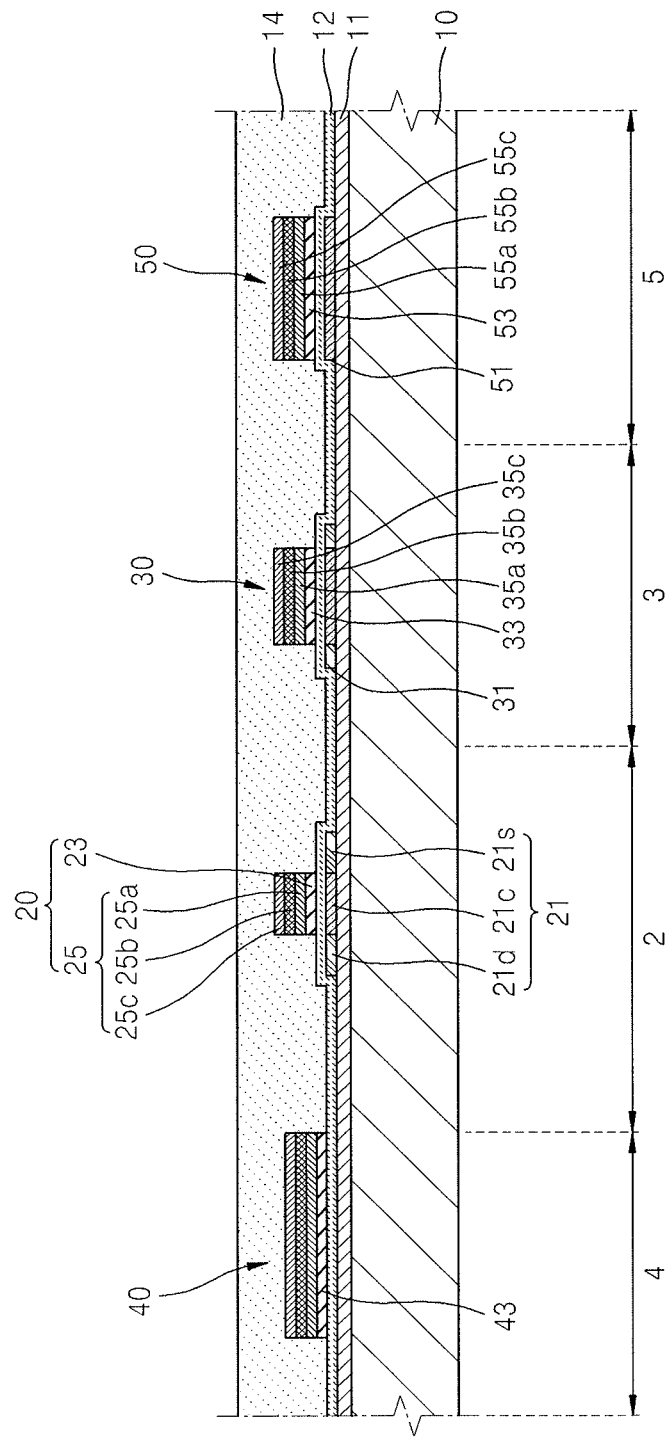

Then, as illustrated in FIG. 7, the interlayer insulation film 14 may be deposited on the whole surface of the first substrate 10 (on which the gate electrode 20 is formed).

The interlayer insulation film 14 may be formed by, e.g., spin coating at least one organic insulating material selected from the group of polyimide, polyamide, an acryl resin, benzocyclobutene, and a phenol resin. The interlayer insulation film 14 may have a sufficient thickness, e.g., a thickness that is greater than that of the gate insulation layer 12 to insulate the gate electrode 20 of the TFT from the source and drain electrodes 29 and 27. Also, the interlayer insulation film 14 may include, instead of the organic insulating materials, an inorganic insulating material, e.g., the same inorganic insulating material, as used in the gate insulation layer 12. In an implementation, an organic insulating material and an inorganic insulating material may be alternately deposited to form the interlayer insulation film 14.

Figure 8:
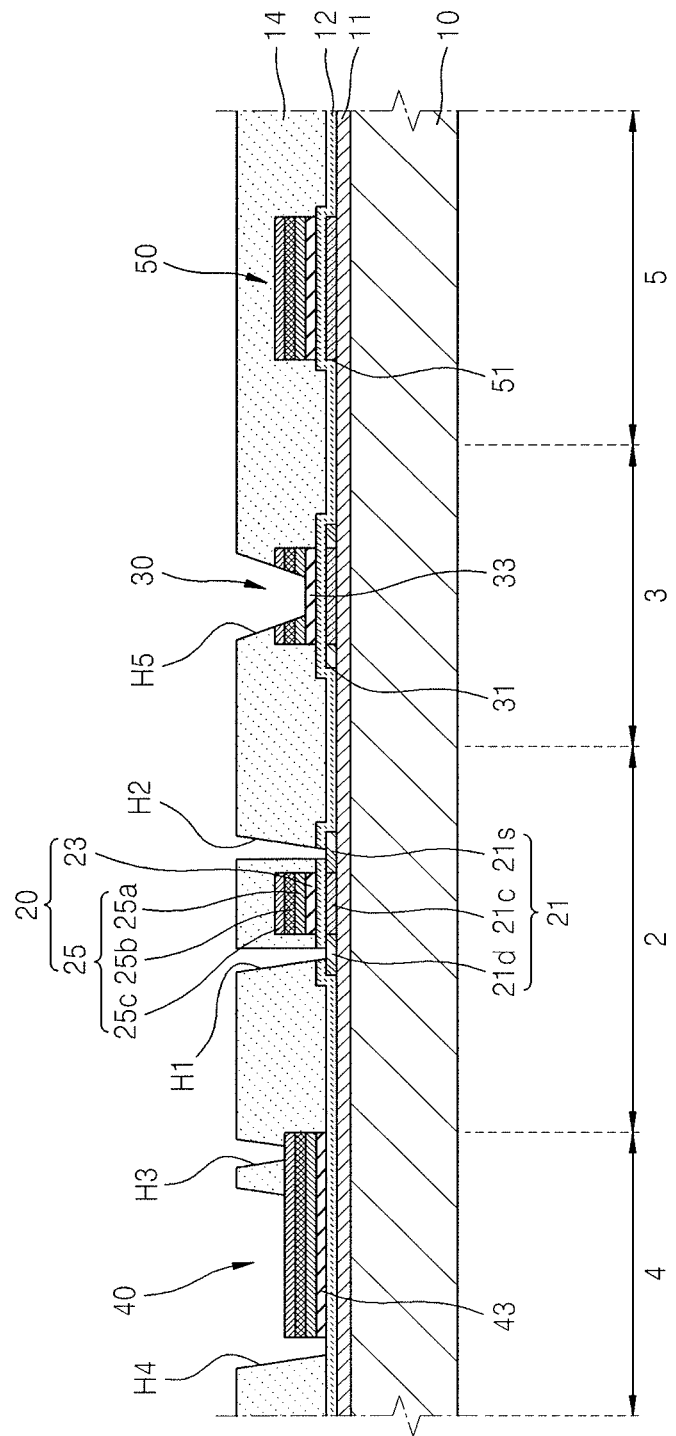

Then, as illustrated in FIG. 8, the interlayer insulation film 14 may be patterned to form openings H3, H4, and H5 (exposing the first and third electrode units 30 and 40) as well as contact holes H1 and H2 (exposing portions of the source and drain regions 21s and 21d of the activation layer 21).

For example, the interlayer insulation film 14 may be patterned by performing a mask process using a third mask (not shown) to form the contact holes and openings H1, H2, H3, H4, and H5. In this regard, the contact holes H1 and H2 may expose portions of the source and drain regions 21s and 21d, and the third opening H3 and the fourth opening H4 may expose at least a portion of the first electrode unit 40. The fifth opening H5 may expose at least a portion of the second electrode unit 30.

Figure 9:
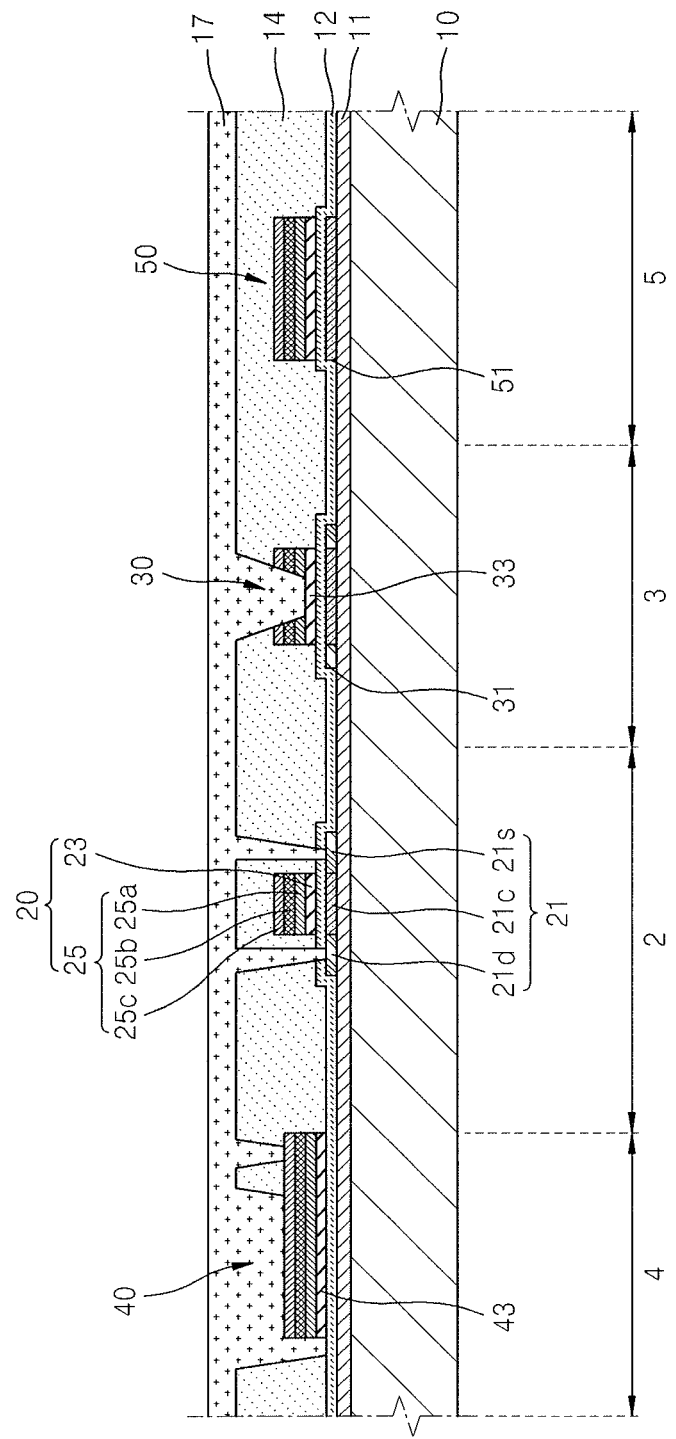

Then, as illustrated in FIG. 9, a third conductive layer 17 may be deposited on the whole surface of the first substrate 10 to cover the interlayer insulation film 14.

The third conductive layer 17 may include a material selected from the above conductive materials used to form the first conductive layer 13 or the second conductive layer 15. However, the material for forming the third conductive layer 17 is not limited thereto, and various other conductive materials may also be used to form the third conductive layer 17. The conductive materials may be deposited to a sufficient thickness to fill the contact holes and the openings H1, H2, H3, H4, and H5.

Figure 10:
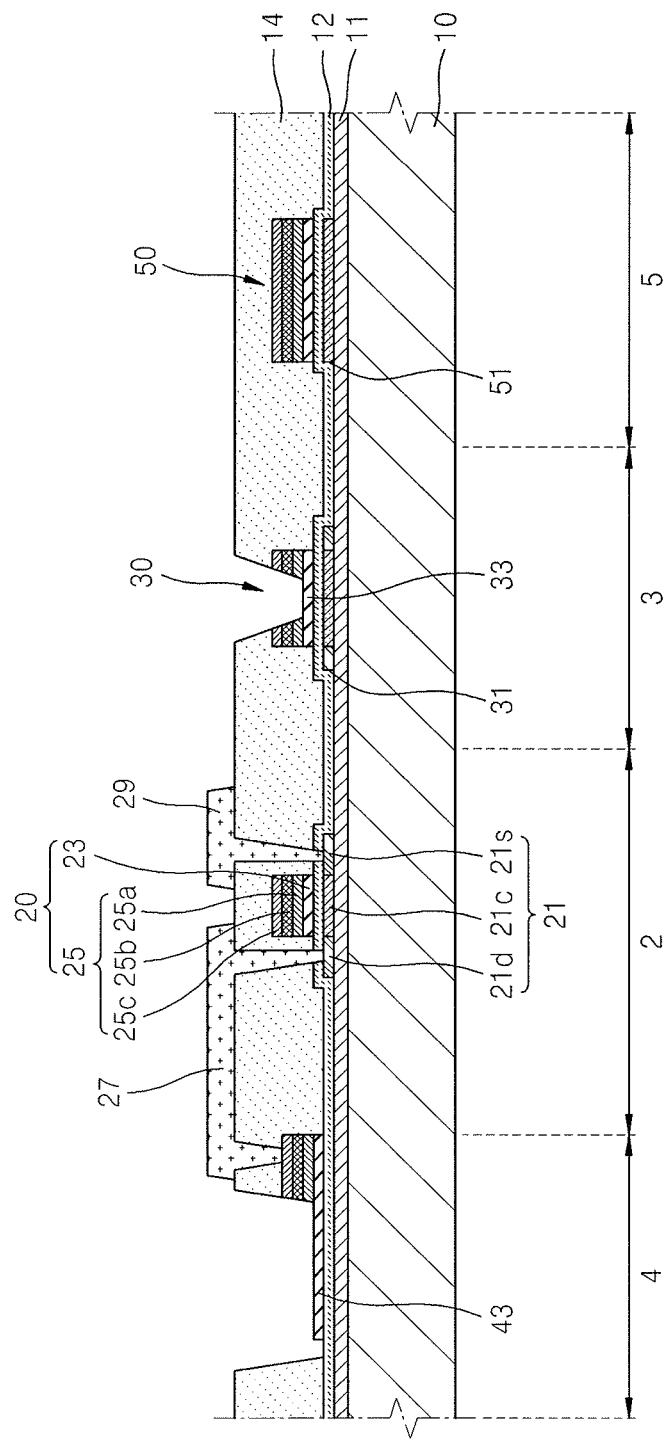

Then, as illustrated in FIG. 10, the third conductive layer (see 17 of FIG. 9) may be patterned to separately form the source and drain electrodes 29 and 27, the pixel electrode 43, and the upper capacitor electrode 33.

For example, the third conductive layer (see 17 of FIG. 9) may be patterned by performing a mask process using a fourth mask (not shown) to form the source and drain electrodes 29 and 27.

In this regard, one of the source and drain electrodes 29 and 27 (in the present embodiment, the drain electrode 27) may be formed to be connected to the pixel electrode 43 via the third opening H3 at the edge of the second conductive layer 15 of the first electrode unit (see 40 of FIG. 8) for forming the pixel electrode 43.

When the source and drain electrodes 29 and 27 are formed, the pixel electrode 43 and the upper capacitor electrode 33 may also formed. However, the embodiments are not limited thereto, and for example, the source and drain electrodes 29 and 27 may be formed and then the pixel electrode 43 and the upper capacitor electrode 33 may separately be formed by additional etching. For example, regarding the first electrode unit (see 40 of FIG. 8), a portion of the second conductive layer 15 exposed by the fourth opening H4 may be removed to form the pixel electrode 43. Also, regarding the third electrode unit (see 30 of FIG. 8), a portion of the second conductive layer 15 exposed by the third opening H3 may be removed to form the upper capacitor electrode 33.

In an implementation, the lower gate electrode 23, the upper capacitor electrode 33, and the pixel electrode 43 may be formed of the same material.

An n-type or p-type impurity may be implanted via the fifth opening H5 to dope the lower capacitor electrode 31. The impurity used for the doping may be the same as or different from the impurity used to dope the activation layer 21.

Figure 11:
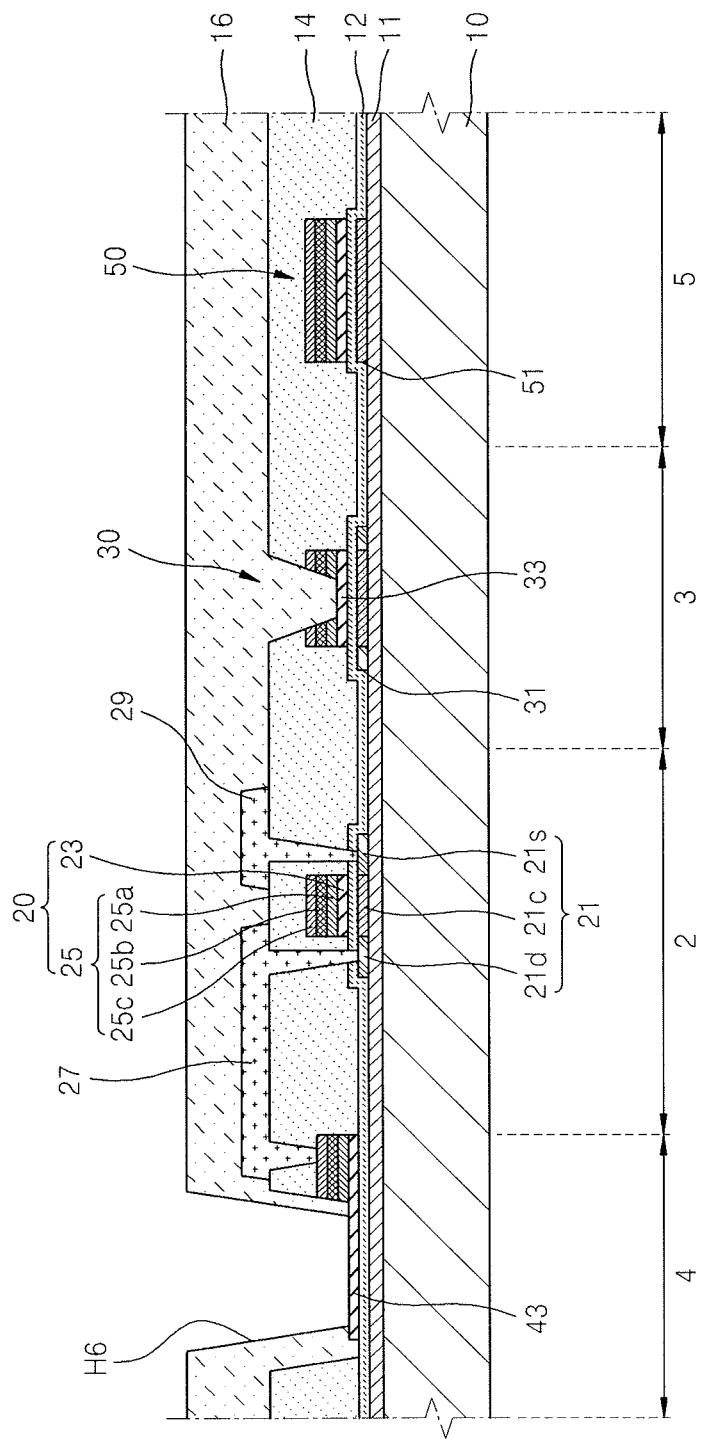

Then, as illustrated in FIG. 11, a pixel defining layer (PDL) 16 may be formed on the first substrate 10.

For example, the PDL 16 may be deposited on the whole surface of the first substrate 10 (on which the pixel electrode 43, the source and drain electrodes 29 and 27, and the upper capacitor electrode 33 are formed). In an implementation, the PDL 16 may be formed by, e.g., spin coating at least one organic insulating material selected from the group of polyimide, polyamide, an acryl resin, benzocyclobutene, and a phenol resin. In an implementation, the PDL 16 may include, instead of the organic insulating materials, an inorganic insulating material selected from $SiO_2$, $SiN_x$, $Al_2O_3$, CuOx, $Tb_4O_7$, $Y_2O_3$, $Nb_2O_5$, and $Pr_2O_3$. Alternatively, an organic insulating material and an inorganic insulating material may be alternately deposited to form the PDL 16.

The PDL 16 may define a pixel by performing a patterning process using a fifth mask (not shown) to from a sixth opening H6 exposing a central portion of the pixel electrode 43.

Then, as illustrated in FIG. 1, the intermediate layer 44 (including the emissive layer) and the opposite electrode 45 may be formed in the sixth opening H6 exposing the pixel electrode 43.

The intermediate layer 44 may be formed by depositing an organic emissive layer (EML), and at least one functional layer selected from a hole transport layer (HTL), a hole injection layer (HIL), an electron transport layer (ETL), and an electron injection layer (EIL), each of which has a single- or multi-layer structure.

The organic EML may include a low molecular weight or a polymeric organic material.

When the organic EML includes the low molecular weight organic material, the intermediate layer 44 may include a HTL and a HIL deposited in a direction toward the pixel electrode 43 from the organic EML, and an ETL and an EIL deposited in a direction toward the opposite electrode 45 from the organic EML. Also, according to purpose, various other layers may also be deposited. Examples of the low molecular weight organic material may include copper phthalocyanine (CuPc), N,N'-di naphthalene-1-yl-N,N'-diphenyl-benzidine (NPB), and tris-8-hydroxyquinoline aluminum ($Alq_3$).

When the organic EML includes the polymeric organic material, the intermediate layer 44 may include only a HTL in the direction toward the pixel electrode 43 from the organic EML. The HTL may be formed by, e.g., inkjet printing or coating poly 3,4-ethylenedioxythiophene (PEDOT) or polyaniline (PANI) on the pixel electrode 43. Examples of the polymeric organic material may include polyphenylene vinylene (PPV) and polyfluorene. These materials may be used to embody a color pattern by inkjet printing, spin coating, or a thermal transferring using a laser which are conventionally used.

The opposite electrode 45 may be deposited on the whole surface of the first substrate 10 for use as a common electrode. Regarding the organic light-emitting display apparatus 1 according to the present embodiment, the pixel electrode 43 may be used as an anode and the opposite electrode 45 may be used as a cathode. In an implementation, the pixel electrode 43 may be used as a cathode and the opposite electrode 45 may be used as an anode.

When the organic light-emitting display apparatus 1 is a bottom emission type display apparatus (in which an image is embodied toward the first substrate 10), the pixel electrode 43 may be a transparent electrode and the opposite electrode 45 may be a reflective electrode. In this regard, the reflective electrode may be formed by depositing a metal having a low work function, e.g., Ag, Mg, Al, Pt, Pd, Au, Ni, Nd, Ir, Cr, Li, Ca, LiF/Ca, LiF/Al, or a compound thereof to a relatively small thickness.

In the respective mask processes for forming the organic light-emitting display apparatus 1, the removal of deposited films may be performed by dry etching or wet etching.

Regarding the light-emitting display apparatus according to an embodiment, the blister prevention layer 51 and the activation layer 21 may be simultaneously formed. Thus, blistering of the first layer 53 of the interconnection unit 50 formed on the gate insulation layer 12 may be reduced and/or prevented without an additional process.

Also, the above embodiments have been described with reference to an organic light-emitting display apparatus. However, the embodiments are not limited thereto, and various other display devices including a liquid crystalline display apparatus may also be applied to the embodiments.

Also, the drawings used to describe the above embodiments illustrate one TFT and one capacitor. However, this structure is adopted for illustrative purpose only and the embodiments are not limited thereto. As long as a number of mask processes is not increased, a plurality of TFTs and a plurality of capacitors may be included.

According to an embodiment, without an additional process, an adhesion defect occurring between a gate insulation layer and a ITO layer of an interconnection unit may be reduced and/or prevented.

While the exemplary embodiment has been particularly shown and described with reference to exemplary embodiments thereof, it will be understood by those of ordinary skill in the art that various changes in form and details may be made therein without departing from the spirit and scope of the exemplary embodiments as defined by the following claims.

What is claimed is:

1. An organic light-emitting display apparatus, comprising:
    a thin film transistor, the thin film transistor including:
        an activation layer,
        a gate electrode insulated from the activation layer, the gate electrode including a lower gate electrode and an upper gate electrode,
        an interlayer insulation film covering the gate electrode, and
        a source electrode and a drain electrode on the insulation film, the source electrode and the drain electrode contacting the activation layer;
    an organic light-emitting device, the organic light-emitting device including, sequentially stacked in this order:
        a pixel electrode electrically connected to the thin film transistor,
        an intermediate layer including an emissive layer, and
        an opposite electrode;
    a blister prevention layer on a same level as the activation layer;
    a gate insulation layer covering the activation layer and the blister prevention layer, the gate insulation layer insulating the activation layer from the gate electrode; and
    an interconnection unit, the interconnection unit including first and second layers on a portion of the gate insulation layer overlying the blister prevention layer,
    wherein:
    the first layer of the interconnection unit includes a transparent conductive metal oxide, and the second layer of the interconnection unit includes at least three metallic layers, each metallic layer including one or more of Ag, Mg, Al, Pt, Pd, Au, Ni, Nd, Ir, Cr, Li, Ca, Mo, Ti, W, MoW, and Cu.

2. The organic light-emitting display apparatus of claim 1, wherein the blister prevention layer has a surface having a plurality of protrusions.

3. The organic light-emitting display apparatus of claim 2, wherein a surface of the gate insulation layer that faces the interconnection unit has a roughness corresponding to the protrusions of the blister prevention layer.

4. The organic light-emitting display apparatus of claim 1, wherein the blister prevention layer includes polysilicon.

5. The organic light-emitting display apparatus of claim 1, wherein the first layer of the interconnection unit, the lower gate electrode, and the pixel electrode each include the transparent conductive metal oxide.

6. The organic light-emitting display apparatus of claim 5, wherein the transparent conductive metal oxide includes at least one selected from the group of indium tin oxide, indium zinc oxide, zinc oxide, indium oxide, indium gallium oxide, and aluminum zinc oxide.

7. The organic light-emitting display apparatus of claim 1, wherein the upper gate electrode includes at least one material selected from the group of Ag, Mg, Al, Pt, Pd, Au, Ni, Nd, Ir, Cr, Li, Ca, Mo, Ti, W, MoW, and Cu.

8. The organic light-emitting display apparatus of claim 1, further comprising a capacitor, the capacitor including:
   a lower capacitor electrode on the same level as the activation layer,
   the gate insulating layer directly on the lower capacitor electrode,
   an upper capacitor electrode directly on the gate insulation layer, and
   wherein the capacitor is electrically coupled to the thin film transistor.

9. The organic light-emitting display apparatus of claim 1, wherein the first layer is on a same level as the lower gate electrode.

10. The organic light-emitting display apparatus of claim 1, wherein the first layer of the interconnection unit includes at least one of indium tin oxide, indium zinc oxide, zinc oxide, indium oxide, indium gallium oxide, and aluminum zinc oxide, and each of the second layers of the interconnection unit include at least one of Mo, MoW, and an Al-based alloy.

11. The organic light-emitting display apparatus of claim 1, wherein the first layer of the interconnection unit includes indium tin oxide, and the three second layers of the interconnection unit have a three layer structure of Mo—Al—Mo.

* * * * *